United States Patent
Huang

(10) Patent No.: US 7,567,115 B2
(45) Date of Patent: Jul. 28, 2009

(54) FUSE-FETCHING CIRCUIT AND METHOD FOR USING THE SAME

(75) Inventor: Pei Jey Huang, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 36 days.

(21) Appl. No.: 11/933,475

(22) Filed: Nov. 1, 2007

(65) Prior Publication Data

US 2009/0115492 A1    May 7, 2009

(51) Int. Cl.
*H01H 37/76* (2006.01)
(52) U.S. Cl. ...................................... 327/525
(58) Field of Classification Search .................. 327/525
See application file for complete search history.

(56) References Cited

U.S. PATENT DOCUMENTS

| | | | |
|---|---|---|---|
| 5,668,818 A * | 9/1997 | Bennett et al. .............. | 714/726 |
| 6,215,351 B1 | 4/2001 | Le et al. | |
| 6,373,771 B1 * | 4/2002 | Fifield et al. .............. | 365/225.7 |
| 6,798,272 B2 * | 9/2004 | Lehmann .................... | 327/525 |
| 7,091,564 B2 | 8/2006 | Hasegawa et al. | |
| 7,177,210 B2 | 2/2007 | Hamada et al. | |
| 7,218,560 B2 | 5/2007 | Fukuda et al. | |

* cited by examiner

*Primary Examiner*—Jeffrey S Zweizig
(74) *Attorney, Agent, or Firm*—Connolly Bove Lodge & Hutz LLP

(57) ABSTRACT

A fuse-fetching circuit comprises a plurality of fuses, a plurality of first switches and a shift register. Each of the first switches includes a first data end, a second data end and a control end. The first data end is connected to the fuse, and the control end is controlled by a fuse-fetching signal. The shift register includes a plurality of registers, each of which includes a first latch, a first transmission gate, a second latch and a second transmission gate. The first latch is connected to the second data end of the first switch.

11 Claims, 3 Drawing Sheets

FUSE-FETCHING CIRCUIT AND METHOD FOR USING THE SAME

BACKGROUND OF THE INVENTION

1. Field of the Invention

The present invention relates to a fuse-fetching circuit, and more particularly, to a highly cost-effective fuse-fetching circuit.

2. Description of the Related Art

Fuses have been widely used in memory devices or consumer product integrated circuits (ICs) to store operations of a semiconductor component. For example, ID fuses are embedded in memory devices or consumer product ICs to record the manufacturing process, such as wafer lot number, positions on the X-axis and Y-axis of the wafer from which the dies of the memory devices or consumer product IC come. Another common practice is that if memory devices install internal recovery circuits, the fuses are used to record (melted and blown by a laser) the locations of defective memory cells. Since there are usually more ID fuses than the output pins of a semiconductor component upon a test mode, serial output from a single or a few pins is commonly seen. After the supply voltage is switched on, the fuse information is read one by one through the single or a few pins.

U.S. Pat. No. 6,215,351 discloses a traditional fuse-latch circuit, which needs additional delay element and latch element to store or control the fuse information, and thus its hardware is costly. U.S. Pat. No. 7,091,564 discloses another traditional fuse-fetching circuit. Please refer to FIG. 1. A fuse unit 10 includes a fuse 11, a latch circuit 12 and a transfer circuit 13, and many fuse units 10 are repeated and arranged in a row to form a fuse unit group. Signals bBP, AN and bTR are used to control or initiate the fuse unit 10. Before the latch information is read, the signal bBP is initiated to reset the latch 12. Then the signal AN is turned on to load the content of the fuse 11 into the latch 12. Next, the signal bTR is initiated to load the content of the latch 12 into the transfer circuit 13. Following each transition of the shifting clock, the fuse information is captured by an external controller. Although the fuse unit 10 can complete the fuse-fetch tasks, its hardware is too costly. Because the structure of the fuse unit 10 is replicated repeatedly to form the fuse unit group, it is necessary to develop a more cost-effective structure of the fuse unit 10 to save the space in the chip area.

SUMMARY OF THE INVENTION

The above-mentioned problems are addressed by the present invention. The structure and method of the present invention will be understood according to the disclosure of the following specification and drawings.

According to one embodiment of the present invention, the fuse-fetching circuit comprises a plurality of fuses, a plurality of first switches and a shift register. Each of the first switches includes a first data end, a second data end and a control end. The first data end is connected to the fuse, and the control end is controlled by a fuse-fetching signal. The shift register includes a plurality of registers, each of which includes a first latch, a first transmission gate, a second latch and a second transmission gate. The first latch is connected to the second data end of the first switch.

According to one embodiment of the present invention, the fuse-fetching circuit comprises a plurality of fuses, a shift register and a plurality of first switches. The shift register includes a plurality of registers. The first switches couple the fuses to the registers.

According to one embodiment of the present invention, the method for using a fuse-fetching circuit comprises the steps of: resetting a shift register, which has a plurality of registers; receiving a fuse-fetching signal from a controller to turn on first switches, which couple fuses to the registers; loading the contents of the fuses into the registers in parallel; and serially reading the shift register to obtain the contents of the fuses.

BRIEF DESCRIPTION OF THE DRAWINGS

The invention will be described according to the appended drawings in which.

DETAILED DESCRIPTION OF THE INVENTION

Figure 1:
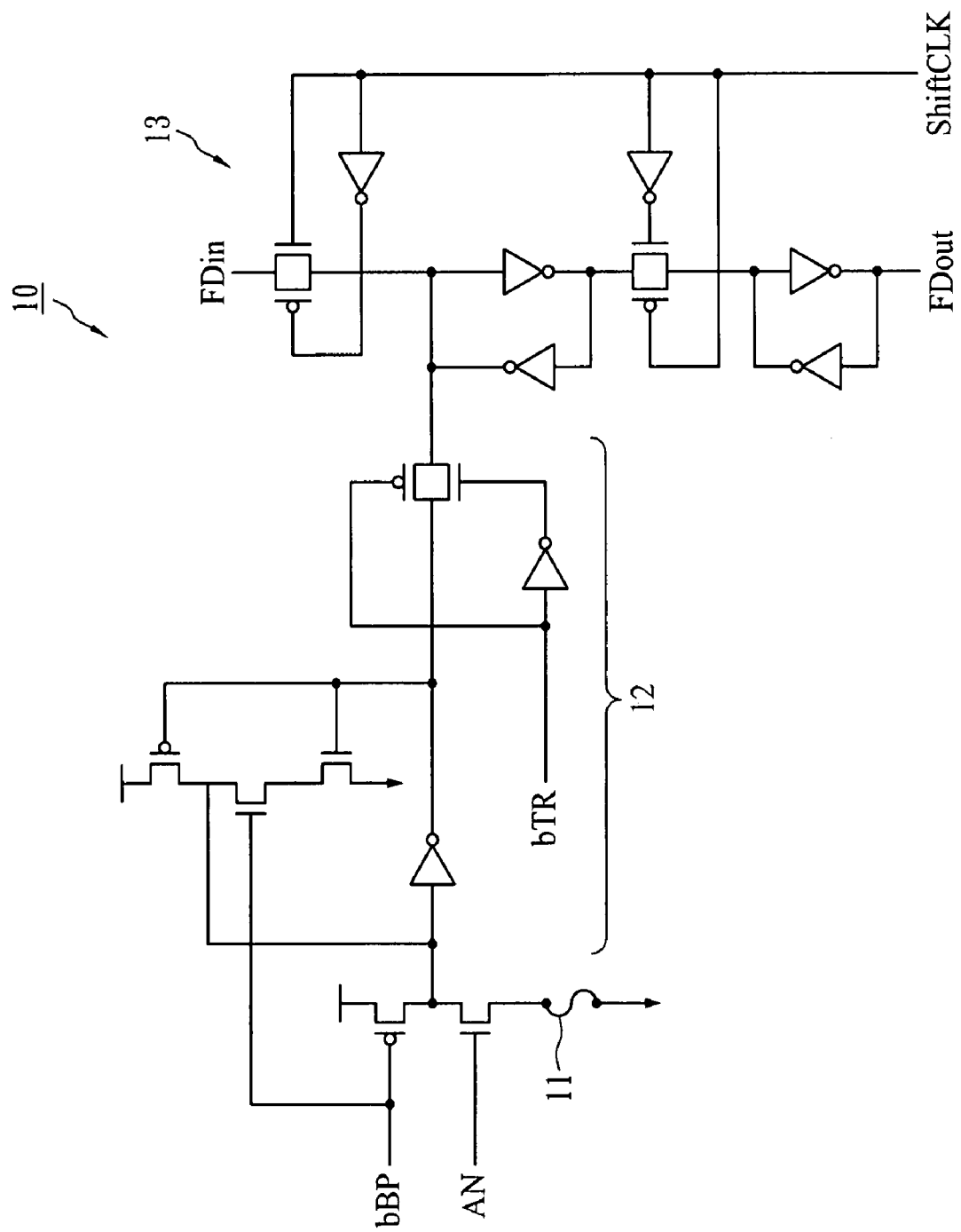
FIG. 1 shows a traditional fuse latch circuit.
Figure 2A:
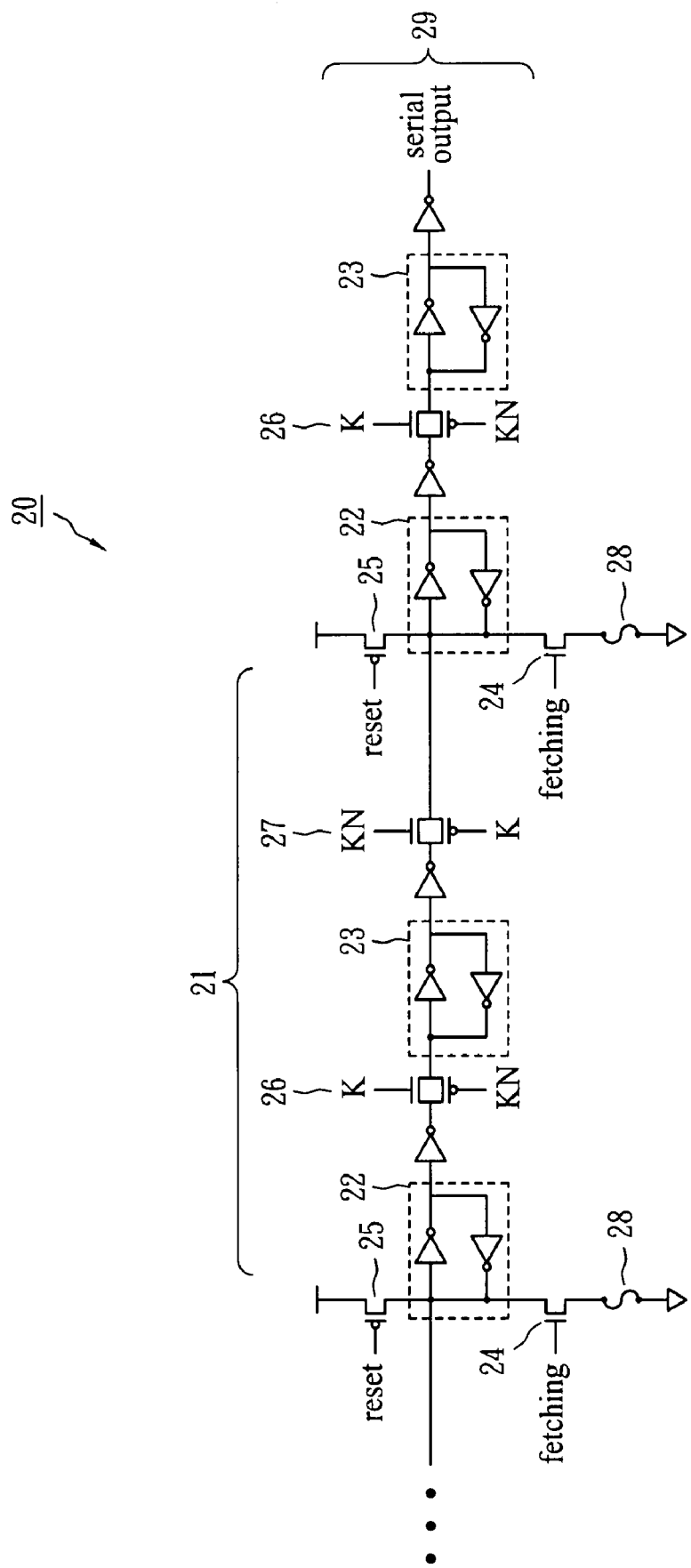
FIG. 2(a) shows a fuse-fetching circuit in accordance with the present invention.

FIG. 2(a) shows a fuse-fetching circuit 20 in accordance with the present invention. The fuse-fetching circuit 20 includes a shift register 29, first switches 24, second switches 25 and fuses 28. The shift register 29 includes a plurality of registers 21, and each register 21 includes a first latch 22, a first transmission gate 26, a second latch 23 and a second transmission gate 27. The first transmission gate 26 and the second transmission gate 27 are controlled by a clock K and its reverse clock KN. When clock K is at logic high, the transmission gate 26 passes the content of the first latch 22 to the second latch 23. When the reverse clock KN is at logic high, the transmission gate 27 passes the content of the second latch 23 to the first latch 22 of the next register 21. The second switch 25, a PMOS transistor, directly couples voltage power to the first latch 22 of the register 21. The second switch 25 is controlled by a reset signal from a controller (not shown). Before the fuses are read, the content of the shift register 29 is filled with logic high signals so as to differentiate it from the fuse content, which is arranged in a logic low state. The first switch 24, a NMOS transistor, directly couples the fuse 28 to the first latch 22 of the register 21. The first switch 24 is controlled by a fuse-fetching signal from a controller.

Figure 2B:
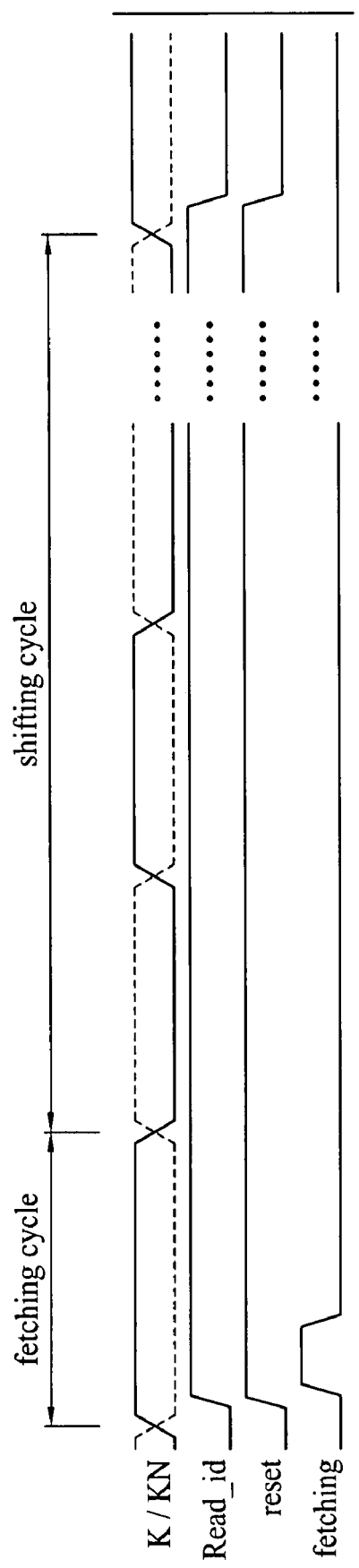
FIG. 2(b) shows a timing diagram of the structure in FIG. 2(a).

Please refer to FIG. 2(b). In a fetching cycle, a fuse-fetching signal is sent from a controller when clock K is at logic high. The fuse-fetching signal turns on the first switch 24 and loads the content of the fuses 28 in parallel into the first latches 22 of the registers 21. After the clock K turns to logic low, the fetching cycle ends and a shifting cycle commences. Generally speaking, during the shifting cycle the shift register 29 forwards the contents of the registers 21 to its serial output end, where the contents of the fuses are read one by one when clock K is at logic high.

The first latch 22 of the embodiment can store the fuse information and receive previous stage data and then pass them to serial output of the shift register 29. In comparison with all prior arts which install additional fuse-latch elements to store fuse information before the fuse information is transferred to the serial output port, the present invention can eliminate unnecessary hardware cost and effectively reduce the layout area.

The above-described embodiments of the present invention are intended to be illustrative only. Numerous alternative embodiments can be devised by those skilled in the art without departing from the scope of the following claims.

What is claimed is:

1. A fuse-fetching circuit, comprising:
   a plurality of fuses;
   a plurality of first switches each having a first data end, a second data end and a control end, wherein the first data end is connected to the fuse, and the control end is controlled by a fuse-fetching signal; and
   a shift register including a plurality of registers, each register including:
      a first latch connected to the second data end of each one of the plurality of first switches;
      a first transmission gate connected to an inverted output of the first latch;
      a second latch connected to an output of the first transmission gate; and
      a second transmission gate connected to an inverted output of the second latch;
      wherein a turn-on period of the first transmission gate does not overlap with a turn-on period of the second transmission gate, and the first switch is turned on during a fetching cycle in the turn-on period of the first transmission gate.

2. The fuse-fetching circuit of claim 1, further comprising a plurality of second switches, each of which has a first data end, a second data end and a control end, wherein the first data end is connected to a voltage supply, the control end is controlled by a reset signal, and the second data end of the second switch is connected to the second data end of the first switch.

3. The fuse-fetching circuit of claim 1, wherein the first transmission gate is switched on by a clock, and the second transmission gate is switched on by the reverse of the clock.

4. The fuse-fetching circuit of claim 1, wherein the first latch has only a forward inverter and a feedback inverter, the output of the forward inverter is connected to the input of the feedback inverter, and the output of the feedback inverter is connected to the input of the forward inverter.

5. A fuse-fetching circuit, comprising:
   a plurality of fuses;
   a plurality of first switches connected to the plurality of fuses;
   a shift register including a plurality of registers, each register including:
      a first latch connected to a second data end of each of the plurality of first switches;
      a first transmission gate connected to an inverted output of the first latch;
      a second latch connected to an output of the first transmission gate;
      a second transmission gate connected to an inverted output of the second latch; and
      wherein a turn-on period of the first transmission gate does not overlap with a turn-on period of the second transmission gate, and each of the plurality of first switches is turned on during a fetching cycle in the turn-on period of the first transmission gate.

6. The fuse-fetching circuit of claim 5, further comprising a plurality of second switches coupling a voltage supply to the shift register.

7. The fuse-fetching circuit of claim 5, wherein the first switches are turned on by a fuse-fetching signal sent from a controller.

8. The fuse-fetching circuit of claim 6, wherein the second switches are turned on by a reset signal sent from a controller.

9. The fuse-fetching circuit of claim 5, wherein the first latch has only a forward inverter and a feedback inverter, the output of the forward inverter is connected to the input of the feedback inverter, and the output of the feedback inverter is connected to the input of the forward inverter.

10. A method for using a fuse-fetching circuit comprising the steps of:
    resetting a shift register, which has a plurality of registers;
    receiving a fuse-fetching signal from a controller to turn on first switches, which couple fuses to the registers;
    loading the contents of the fuses into the registers in parallel; and
    serially reading the shift register to obtain the contents of the fuses,
    wherein, each register including:
       a first latch connected to a second data end of a first switch;
       a first transmission gate connected to an inverted output of the first latch;
       a second latch connected to an output of the first transmission gate; and
       a second transmission gate connected to an inverted output of the second latch;
       wherein a turn-on period of the first transmission gate does not overlap with a turn-on period of the second transmission gate, and the first switch is turned on during a fetching cycle in the turn-on period of the first transmission gate.

11. The fuse-fetching circuit of claim 10, wherein the first latch has only a forward inverter and a feedback inverter, the output of the forward inverter is connected to the input of the feedback inverter, and the output of the feedback inverter is connected to the input of the forward inverter.

* * * * *